(12) United States Patent
Dargis et al.

(10) Patent No.: US 9,142,406 B1
(45) Date of Patent: Sep. 22, 2015

(54) III-N MATERIAL GROWN ON ERALN BUFFER ON SI SUBSTRATE

(71) Applicants: Rytis Dargis, Fremont, CA (US); Andrew Clark, Los Altos, CA (US); Nam Pham, Palo Alto, CA (US); Erdem Arkun, Campbell, CA (US)

(72) Inventors: Rytis Dargis, Fremont, CA (US); Andrew Clark, Los Altos, CA (US); Nam Pham, Palo Alto, CA (US); Erdem Arkun, Campbell, CA (US)

(73) Assignee: Translucent, Inc., Palo Alto, CA (US)

( * ) Notice: Subject to any disclaimer, the term of this patent is extended or adjusted under 35 U.S.C. 154(b) by 0 days.

(21) Appl. No.: 14/269,011

(22) Filed: May 2, 2014

(51) Int. Cl.
*H01L 21/20* (2006.01)
*H01L 21/02* (2006.01)
*H01L 29/20* (2006.01)
*H01L 29/205* (2006.01)

(52) U.S. Cl.
CPC ........ *H01L 21/0251* (2013.01); *H01L 21/0242* (2013.01); *H01L 21/0254* (2013.01); *H01L 21/02381* (2013.01); *H01L 21/02458* (2013.01); *H01L 21/02694* (2013.01); *H01L 29/2003* (2013.01); *H01L 29/205* (2013.01)

(58) Field of Classification Search
CPC ............ H01L 21/02458; H01L 21/335; H01L 21/0251
USPC .............................................. 438/478; 257/76
See application file for complete search history.

(56) References Cited

U.S. PATENT DOCUMENTS

2010/0308375 A1* 12/2010 Birkhahn ....................... 257/194
2014/0321488 A1* 10/2014 Chen et al. ....................... 372/34

* cited by examiner

*Primary Examiner* — Bradley K Smith
(74) *Attorney, Agent, or Firm* — Robert A. Parsons; Michael W. Goltry; Parsons & Goltry

(57) ABSTRACT

III-N material grown on a buffer on a substrate that includes one of a single crystal silicon or a single crystal sapphire. A buffer of single crystal alloy, including one of $Er_xAl_{1-x}N$ or $(RE1_yRE2_{1-y})_xAl_{1-x}N$, is positioned on the substrate. A layer of single crystal III-N material is positioned on the surface of the buffer and the single crystal alloy has a lattice constant substantially crystal lattice matched to the layer of single crystal III-N material. When the III-N material is GaN, the x in the formula for the alloy varies from less than 1 adjacent the substrate to greater than or equal to 0.249 adjacent the layer of single crystal GaN.

16 Claims, 2 Drawing Sheets

| MATERIAL | THETA, DEGREES | LATTICE CONSTANT A (IN C PLANE), Å | MISMATCH TO GaN, % |
|---|---|---|---|
| a-Al$_2$O$_3$ |  | 4.780 | -13.8* |
| AlN | 18.043 | 3.111 | -2.51 |
| GaN | 17.297 | 3.189 | x |
| ErN | 16.047 | 3.424 | 6.86 |
| Er$_2$O$_3$ | 14.637 | 3.729 | 14.48 |
| Si | 14.226 | 3.840 | 16.96 |

III-N MATERIAL GROWN ON ERALN BUFFER ON SI SUBSTRATE

FIELD OF THE INVENTION

This invention relates in general to the growth of III-N material on a silicon substrate and more specifically to the formation of an ErAlN buffer crystal lattice matched to the III-N layer.

BACKGROUND OF THE INVENTION

In the semiconductor industry, it is known that growing a III-N material, such as GaN, on a silicon substrate is difficult, due in large part to the large crystal lattice mismatch (−16.9%) and the thermal mismatch (53%) between silicon and GaN. Thus, some type of buffer layer or layers is generally formed on the silicon substrate and the III-N material is grown on the buffer layer. Generally, the prior art buffer layers are either, complicated and expensive to form or do not adequately reduce the strain in the GaN due to crystal lattice mismatch.

In the prior art, various attempts are disclosed for the growth of different devices including III-V materials on silicon and other substrates. An article entitled "Growth of Atomically smooth AlN films with a 5:4 Coincidence Interface" by Shenk et al. in *Materials Science and Engineering* B59 (1999) 84-87, describes a SAW (Surface Acoustic Wave) device on Si(111) a substrate. An article entitled "Growth and Optical Properties of Gadolinium Aluminum Nitride Thin Films" by Chen et al. in *Phys. Status Solidi* C9, No. 3-4, 1040-1042 (2012), describes the growth of $Gd_xAl_{1-x}N$ on silicon substrate (100) for the enhanced emission of UV luminescence at about 310 nm. In a U.S. Pub. 2010/0308375 entitled "Rare Earth Enhanced High Electron Mobility Transistor and Method for Fabricating Same", Birkham describes a device including an optional buffer of GaN, AlN, or ZnO. The buffer can be eliminated if the substrate is a "suitable native substrate" which III-V material can be grown directly on (no examples given). An insulator layer of intrinsic GaN deposited on the buffer is doped with a rare earth to improve the insulating qualities. An article entitled "Visible Cathodoluminescence of Er-doped Amorphous AlN Thin Films" by Guruvmurugan et al. in *Appl. Phys. Lett.* 74, 3008 (1999) describes the cathodoluminescence of erdium doped amorphous AlN. In all of these articles and publications the rare earth does not appear to be included for any deposition enhancement but for the optical qualities. Plus in the Guruvmurugan et al. article the material is amorphous so that no crystal matching is possible or required.

It would be highly advantageous, therefore, to remedy the foregoing and other deficiencies inherent in the prior art.

Accordingly, it is an object of the present invention to provide new and improved methods for the growth of single crystal III-N material on a silicon substrate.

It is another object of the present invention to provide new and improved methods for the growth of single crystal III-N material on a silicon substrate with reduced dislocation density and relatively simple to perform.

It is another object of the present invention to provide new and improved substantially stress free, single crystal III-N layers grown on a silicon substrate.

SUMMARY OF THE INVENTION

Briefly, the desired objects and aspects of the instant invention are realized in III-N material grown on a buffer on a substrate that includes one of single crystal silicon or single crystal sapphire. The buffer is a single crystal alloy, including one of $Er_xAl_{1-x}N$ or $(RE1_yRE2_{1-y})_xAl_{1-x}N$, epitaxially grown on the substrate. That is for example other rare earth metals such as Lu, Yb, Gd, etc. could be used as the RE1 and/or RE2 for desired matching of the lattice constant. A layer of single crystal III-N material is epitaxially grown on the surface of the buffer and the single crystal alloy has a lattice constant substantially crystal lattice matched to the layer of single crystal III-N material. When the III-N material is GaN, the x in the formula for the alloy varies from less than 1 adjacent the substrate to greater than or equal to 0.249 adjacent the layer of single crystal GaN.

The desired objects and aspects of the instant invention are further realized in accordance with a preferred method of growing III-N material on a buffer on a substrate including the step of providing a single crystal substrate including one of silicon or sapphire. The method further includes epitaxially growing a single crystal buffer on the substrate, the single crystal buffer including one of $Er_xAl_{1-x}N$ or $(RE1_yRE2_{1-y})_xAl_{1-x}N$, epitaxially growing a layer of single crystal III-N material on the surface of the buffer, and adjusting x in the single crystal alloy to provide a lattice constant at an interface with the layer of single crystal III-N material substantially crystal lattice matched to the layer of single crystal III-N material.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF THE DRAWINGS

Figures 1, 2:
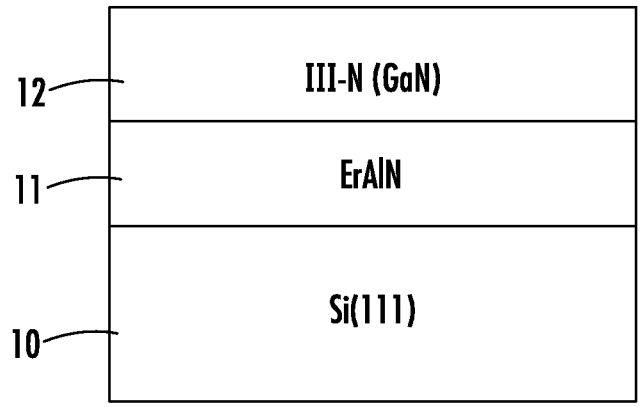
FIG. 1 is a simplified layer diagram illustrating a method of growing III-N material on a silicon substrate, in accordance with the present invention.
FIG. 2 is a chart illustrating the crystal lattice constant and mismatch between GaN and various materials pertinent to the invention.

Turning to FIG. 1, a simplified layer diagram is illustrated representing several steps in a process of growing III-N material, in this preferred example GaN, on a silicon substrate 10, in accordance with the present invention. It will be understood that substrate 10 is or may be a standard well known single crystal wafer or portion thereof generally known and used in the semiconductor industry. Also, the term "substrate" simply refers to a supporting structure and may be a layer of silicon-containing material positioned on a base layer of other material such as an oxide or the like. Single crystal substrates, it will be understood, are not limited to any specific crystal orientation but could include (111) silicon, or any other orientation or variation known and used in the art coming within the definition of Si(11n), where n>0. However, throughout this disclosure substrate 10 is illustrated with a preferred (111) orientation because of the simplification of further operations.

Silicon has a cubic crystal orientation and many other III-N materials, such as GaN, have a hexagonal crystal orientation. Epitaxially growing hexagonal crystals onto cubic crystals will generally generate huge lattice mismatch and a large dislocation density or crystal defects which will limit the usefulness of the material for device design. Further, because of the mismatch and subsequent dislocation density or defects, the thickness of a layer of III-N material is severely limited since the defects expand as the thickness becomes greater. Thus, it is difficult to grow single crystal GaN onto a single crystal silicon substrate since the different crystals of the two materials are difficult or impossible to lattice match.

In the present invention, as illustrated in FIG. 1, an electrical buffer 11 of single crystal erbium-aluminum-nitride (ErAlN) is epitaxially grown on silicon substrate 10. While erbium is the preferred rare earth material, any rare earth material that crystallizes into a cubic form, such as any of the rare earths with a larger atomic number than gadolinium can be used. Also, the nitrides, such as LaN and GaN have a cubic rock salt structure (in contrast to the oxides) so they could also be used from a point of view of a structure. However, the lattice of the rare earth nitrides is larger so that YbN or LuN with a smaller lattice might be more useful in the present invention. Single crystal erbium-aluminum-nitride (ErAlN) is epitaxially grown on silicon substrate 10 preferably by MBE but could instead be grown by MOCVD or any other technique, depending upon the specific application and additional growth techniques utilized. Further, the erbium in small amounts is a substitutional impurity in the AlN and will not change the crystal structure, it will however render the AlN electrically insulating and remedies conductive paths through the substrate that can result in device breakdown.

The epitaxial growth of single crystal ErAlN buffer 11 is possible for the following reasons. As is known in the art, there is a 5:4 lattice co-incidence between AlN and Si or approximately a −1.2% misfit or mismatch leading to a reduced dislocation density. By adding Er into the AlN lattice the misfit can be fine-tuned to achieve a better lattice spacing, i.e. a misfit less than approximately −1.2% with substrate 10. Thus, by varying the Er content of ErAlN buffer 11 the crystal lattice spacing can be substantially lattice matched to silicon substrate 10 with very little strain.

Figure 3:
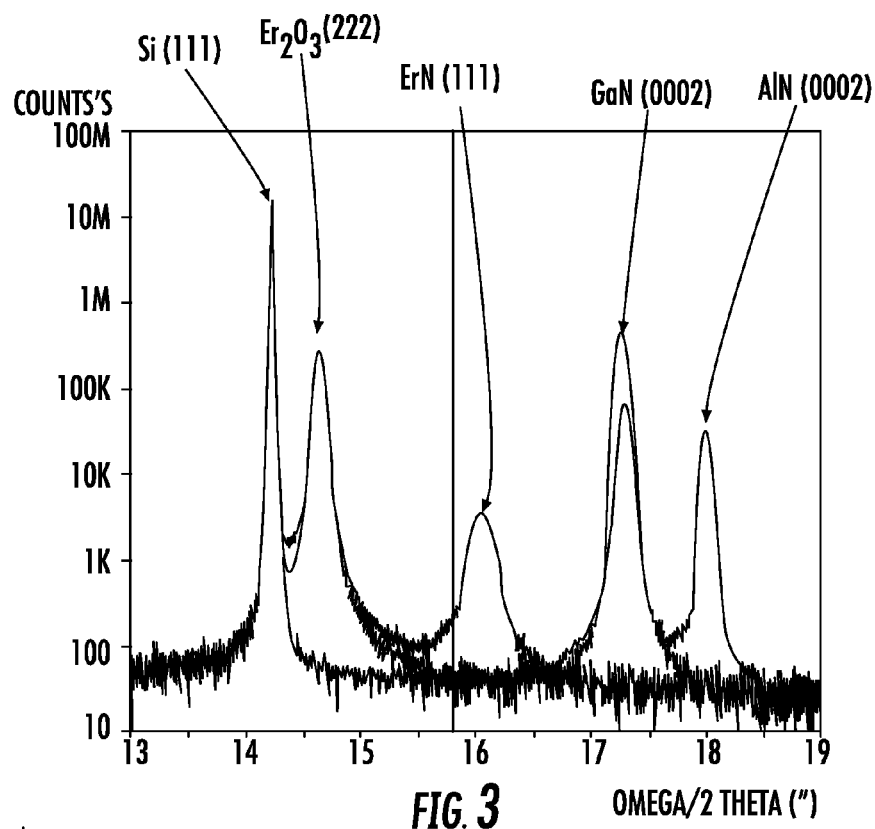
FIG. 3 is a graph illustrating XRD data for various materials pertinent to the invention.

Referring to FIG. 2, a chart including various materials pertinent to the invention (i.e. AlN, GaN, ErN, $Er_2O_3$, and Si) is shown including the lattice constant and mismatch of the various materials with GaN. As can be seen with an additional reference to the graph of FIG. 3, ErN crystallizes into a cubic form and AlN crystallizes into a hexagonal form. However, ErAlN will preserve the hexagonal crystal structure for low concentrations of Er. It can also be seen from the chart of FIG. 2 and the graph of FIG. 3 that an alloy combining ErN and AlN can be devised that would enable the design of a material with a lattice constant (in c-plane) equal to the lattice constant of GaN. The form of this alloy is $Er_xAl_{1-x}N$. In the calculation of the lattice constant, $a_{alloy} = a_{ErN} + X)*(a_{AlN} - a_{ErN})$ or $a_{alloy} = a_{AlN} + X(a_{ErN} - a_{AlN})$, both derived from Vegard's law: $a_{alloy} = a_{ErN}*X + a_{AlN}*(1-X)$. With $a_x = 0.0.249$ the lattice constant of the alloy is 3.189 Å, which is the lattice constant of GaN (see chart in FIG. 2). Since in many applications some compressive or tensile stress may be desired in the GaN layer, the term "substantially lattice matched" is defined in this disclosure to include everything between an exact lattice match and a small percentage of mismatch required to produce a desired stress.

Figure 4:
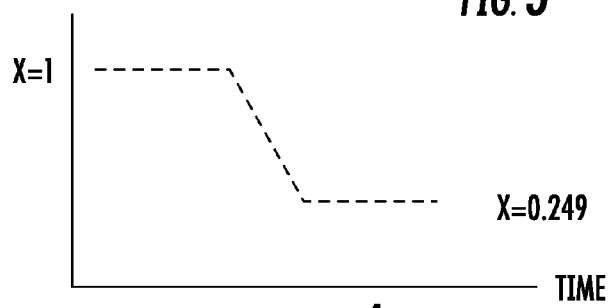
FIG. 4 illustrates a method of growing the III-N material on a silicon substrate of FIG. 1.

Referring to FIG. 4, a method of growing the described alloy on silicon substrate 10 is illustrated. In this method of growing the alloy $Er_xAl_{1-x}N$ into layer 11, X is set to 1 (one) at and adjacent to the interface with substrate 10 or any additional buffer layer (not shown). As the thickness of layer 11 progresses, the value of x is gradually lowered and ultimately changed to 0.249 adjacent and at the upper surface. It will be understood that an additional buffer layer or layers may be included between buffer layer 11 and substrate 10 if a lattice match closer than the match between ErN (i.e. x=1) and Si is desired. Such an additional buffer layer might include, for example, $Er_2O_3$.

Figure 5:
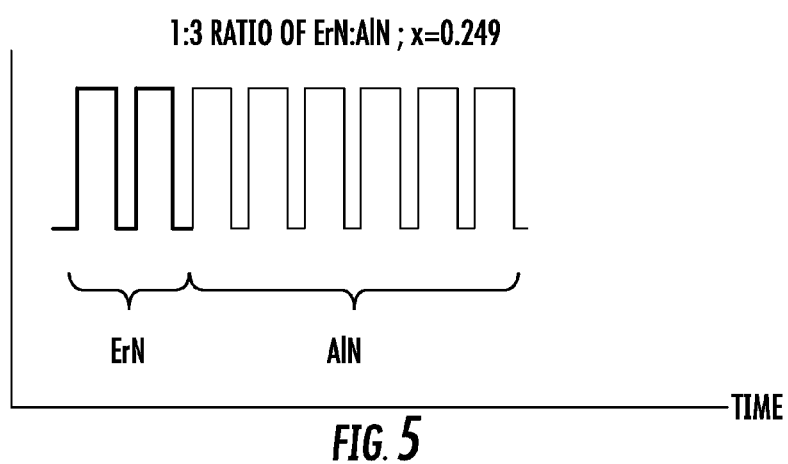
FIG. 5 illustrates another method of growing the III-N material on a silicon substrate of FIG. 1.

Turning to FIG. 5, another method of changing the composition of buffer layer 11 is illustrated. This method is a so called digital alloy using a metal modulated approach. This method, including six pulses of ErN and four pulses of AlN over a period of time, results in a 6:4 ratio of ErN:AlN or x=0.6.

AlN has a stable hexagonal wurtzite structure and ErN has a stable cubic rock-salt structure. However, it is important to note that the cubic phase of the ternary alloy $Er_xAl_{1-x}N$ can be epitaxially stabilized when grown on a cubic template layer.

While the above examples are directed to the use of ErN in an alloy with AlN, it should be understood that other more generic alloys could be used, such as an alloy in the form of $(RE1_yRE2_{1-y})_xAl_{1-x}N$, where RE1 and RE2 are different metals from the lanthanide series plus y and Sc. It should also be noted that the crystal lattice matching alloy buffer can be used for the growth of GaN on a sapphire substrate in special applications. As an example: when a silicon substrate is used, in the alloy $Er_xAl_{1-x}N$, x will vary from less than 1 to greater than or equal to 0.249: and when a sapphire (i.e. $Al_2O_3$) substrate is used, x will vary from greater than zero to less than 0.249.

With layer 11 of alloy $Er_xAl_{1-x}N$ or $(RE1_yRE2_{1-y})_xAl_{1-x}N$ in place, a layer 12 of GaN can be epitaxially grown on the surface thereof, as illustrated in FIG. 1. Because layer 11 is specifically engineered to lattice match the GaN of layer 12 at the interface, layer 12 will have a substantially reduced dislocation density and will be substantially stress free. Also, because of the substantially reduced dislocation density the thickness of layer 12 can be increased for the improved fabrication of various electronic and photonic devices.

Thus, new and improved methods for the growth of single crystal III-N material are disclosed. The new and improved methods for the III-N material include the growth of a substantially crystal lattice matching alloy of single crystal $Er_xAl_{1-x}N$ or $(RE1_yRE2_{1-y})_xAl_{1-x}N$ with the Er content being varied to further reduce or engineer the strain leading to a reduced dislocation density in a GaN layer. Also, the buffer eliminates or greatly reduces the problem of possibly damaging the silicon substrate with process gasses. In special applications the crystal lattice matching alloy can include $(RE1_yRE2_{1-y})_xAl_{1-x}N$. Also, the substrate can be silicon of sapphire.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. III-N material grown on a buffer on a substrate comprising:
   a single crystal sapphire substrate;
   a buffer of single crystal alloy, including one of $Er_xAl_{1-x}N$ or $(RE1_yRE2_{1-y})_xAl_{1-x}N$, positioned on the substrate, and the x in the alloy varies from greater than zero adjacent the substrate, so that the buffer is substantially crystal lattice matched to the surface of the sapphire substrate, to less than 0.249;

a layer of single crystal III-N material positioned on the surface of the buffer, the III-N material having a lattice constant; and the single crystal alloy having a lattice constant substantially lattice matched to the layer of single crystal III-N material.

2. III-N material grown on a buffer on a substrate comprising:

a single crystal silicon substrate;

a buffer of single crystal alloy, including one of $Er_xAl_{1-x}N$ or $(RE1_yRE2_{1-y})_xAl_{1-x}N$, positioned on the substrate, the x in the alloy varies from less than 1 to greater than or equal to 0.249;

a layer of single crystal III-N material positioned on the surface of the buffer, the III-N material having a lattice constant; and the single crystal alloy having a lattice constant substantially lattice matched to the layer of single crystal III-N material.

3. The III-N material grown on the buffer on the substrate as claimed in claim 2 wherein the x in the alloy varies from less than 1 adjacent the substrate so that the buffer is substantially crystal lattice matched to the surface of the silicon substrate.

4. III-N material grown on a buffer on a substrate comprising:

one of a single crystal silicon or a single crystal sapphire substrate;

a buffer of single crystal alloy, including one of $Er_xAl_{1-x}N$ or $(RE1_yRE2_{1-y})_xAl_{1-x}N$, positioned on the substrate;

a layer of single crystal III-N material positioned on the surface of the buffer, the III-N material includes GaN with a lattice constant of approximately 3.189 Å; and the single crystal alloy having a lattice constant substantially lattice matched to the layer of single crystal III-N material.

5. The III-N material grown on the buffer on the substrate as claimed in claim 4 wherein the substrate is single crystal silicon, the single crystal alloy is $Er_xAl_{1-x}N$ and x varies from approximately 1 adjacent the substrate to 0.249 at an interface with the GaN.

6. III-N material grown on a buffer on a silicon substrate comprising:

a single crystal silicon substrate;

a buffer of single crystal alloy positioned on the substrate, the alloy being defined by $Er_xAl_{1-x}N$;

a layer of single crystal GaN positioned on the surface of the buffer, the GaN having a lattice constant; and the x in the single crystal alloy varying from less than 1 adjacent the substrate to greater than or equal to 0.249 adjacent the layer of single crystal GaN so that the single crystal alloy has a lattice constant adjacent the layer of single crystal GaN substantially lattice matched to the layer of single crystal GaN.

7. A method of growing III-N material on a buffer on a substrate, the method comprising the steps of:

providing a single crystal substrate including one of silicon and sapphire;

epitaxially growing a single crystal buffer on the substrate, the single crystal buffer including one of $Er_xAl_{1-x}N$ or $(RE1RE2_{1-y})_xAl_{1-x}N$;

epitaxially growing a layer of single crystal III-N material on the surface of the buffer; and adjusting x in the single crystal alloy, during the step of epitaxially growing the single crystal buffer, to provide a lattice constant at an interface with the layer of single crystal III-N material substantially lattice matching the layer of single crystal III-N material.

8. The method as claimed in claim 7 wherein the step of providing the substrate includes providing a single crystal silicon substrate and the step of adjusting x in the single crystal alloy includes varying x in the alloy from less than 1 adjacent the substrate to greater than or equal to 0.249 adjacent the layer of single crystal III-N material.

9. The method as claimed in claim 7 wherein the step of providing the substrate includes providing a single crystal sapphire substrate and the step of adjusting x in the single crystal alloy includes varying x in the alloy from greater than 0 adjacent the substrate to less than 0.249 adjacent the layer of single crystal III-N material.

10. The method as claimed in claim 7 wherein the step of adjusting x includes linearly grading x from a first value adjacent the substrate to a second value adjacent the layer of single crystal III-N material.

11. The method as claimed in claim 7 wherein the step of adjusting x includes using a metal modulated approach from a first value adjacent the substrate to a second value adjacent the layer of single crystal III-N material.

12. The method as claimed in claim 7 wherein the step of epitaxially growing the single crystal buffer on the substrate includes growing an alloy defined by $Er_xAl_{1-x}N$.

13. The method as claimed in claim 12 wherein the step of epitaxially growing the layer of single crystal III-N material includes epitaxially growing a layer of single crystal GaN.

14. The method as claimed in claim 13 wherein the step of adjusting x in the single crystal alloy includes varying x in the alloy from less than 1 adjacent the substrate to greater than or equal to 0.249 adjacent the layer of single crystal GaN.

15. The method as claimed in claim 14 wherein the step of varying x includes linearly grading x from less than 1 adjacent the substrate to greater than or equal to 0.249 adjacent the layer of single crystal GaN.

16. The method as claimed in claim 14 wherein the step of varying x includes using a metal modulated approach from less than 1 adjacent the substrate to greater than or equal to 0.249 adjacent the layer of single crystal GaN.

* * * * *